United States Patent [19]
Morgan et al.

[11] Patent Number: 5,162,980
[45] Date of Patent: Nov. 10, 1992

[54] SHIELDED PRINTED CIRCUIT BOARD HOUSING FOR HIGH DENSITY STORAGE

[75] Inventors: Stuart K. Morgan, Westford; Michael Romm, Brighton; Gary Vacon, Melrose; John Visser, Wakefield; Margaret Hetfield, Arlington; Peter Bellomo, Natick, all of Mass.

[73] Assignee: Digital Equipment Corporation, Maynard, Mass.

[21] Appl. No.: 682,573

[22] Filed: Apr. 8, 1991

[51] Int. Cl.⁵ .............................. H05K 9/00
[52] U.S. Cl. .................. 361/424; 174/35 R; 174/35 GC; 361/399
[58] Field of Search ............. 174/35 R, 51; 206/334; 220/4.28, 625; 248/27.1; 312/287, 289; 361/390–395, 399, 412, 413, 415, 424, 429; 439/59–62, 135, 136, 630

[56] References Cited

U.S. PATENT DOCUMENTS

| | | | |
|---|---|---|---|
| 3,992,654 | 11/1976 | Springer et al. | 361/415 |
| 4,488,468 | 12/1984 | Peterson et al. | 361/380 |
| 4,567,317 | 1/1986 | Ehrlich et al. | 361/424 |
| 4,585,122 | 4/1986 | Stegenga | 206/334 |
| 4,609,104 | 8/1986 | Kasper et al. | 206/334 |
| 4,672,511 | 6/1987 | Mensel et al. | 361/415 |
| 4,858,071 | 8/1989 | Manabe et al. | 361/395 |
| 4,991,056 | 2/1991 | Shimizu et al. | 361/395 |
| 5,031,070 | 7/1991 | Hsu | 361/380 |
| 5,099,391 | 3/1992 | Maggelet et al. | 361/395 |

FOREIGN PATENT DOCUMENTS

| | | | |
|---|---|---|---|
| 7639989 | 3/1977 | Fed. Rep. of Germany | 361/415 |
| 0222500 | 9/1989 | Japan | 361/390 |
| 0168696 | 6/1990 | Japan | 361/413 |
| 0285698 | 11/1990 | Japan | 361/390 |
| 0301978 | 12/1990 | Japan | 439/630 |
| 2202381 | 9/1988 | United Kingdom | 361/390 |
| 2212334 | 7/1989 | United Kingdom | 361/390 |

OTHER PUBLICATIONS

Toshiba "T1600 Portable Personal Computer" Manual, 1st Ed., Sep. 1988.

Primary Examiner—Leo P. Picard
Assistant Examiner—D. Sparks
Attorney, Agent, or Firm—Cesari and McKenna

[57] ABSTRACT

An EMI/RFI shielded printed circuit board housing of compact design suitable for computer system products (such as, e.g., bridges and repeaters) permits such products to be used on office work surfaces or in a wall-mounted, high density storage system within an office environment. The housing has a five-sided printed-circuit-board container with a back wall defining at least on window for exposing an electrical connector that requires access from the exterior of the container, a removable front cover, a removable trough-shaped rear cover for covering the container back wall and protecting the exposed connector located threat. The back wall is equipped with support features for permitting the housing to be supported in the high density storage system during use. The container and front cover have a plurality of interior surfaces coated with an EMI/RFI shielding material. In other aspects of the invention, the housing has printed-circuit-board-support features for precisely positioning and supporting the printed-circuit-board within the housing in such a way as to avoid contact between the printed circuit board circuitry and the EMI/RFI-shielding material. In addition, the housing has a connector-access button defining a recessed interior volume into which extends a male electrical connector mounted on the printed circuit board.

27 Claims, 5 Drawing Sheets

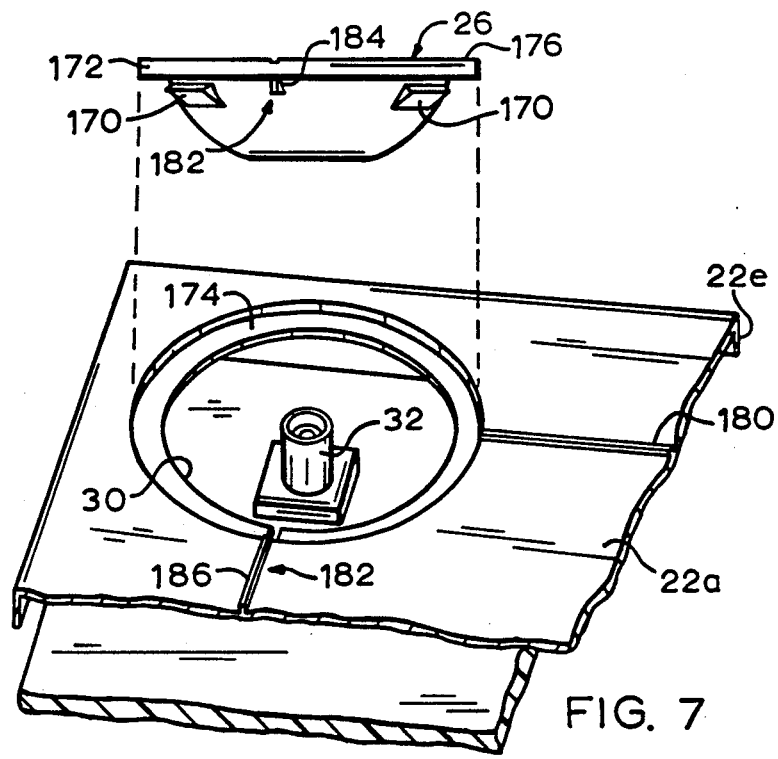
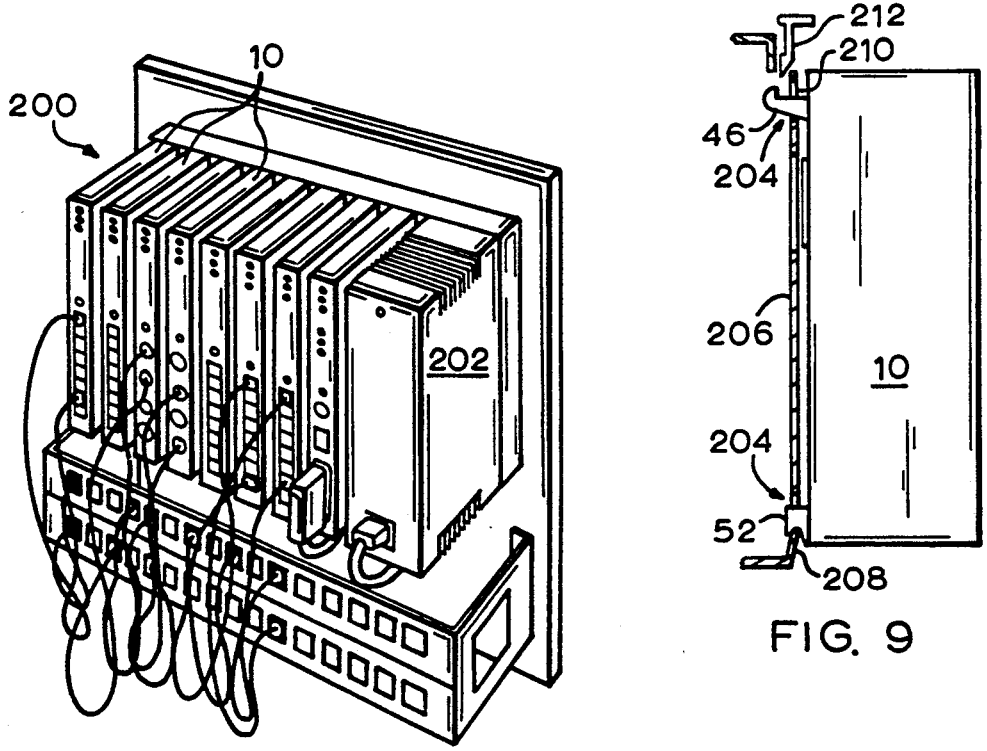
FIG. 7
FIG. 8
FIG. 9

SHIELDED PRINTED CIRCUIT BOARD HOUSING FOR HIGH DENSITY STORAGE

RELATED APPLICATION

This invention is related to co-pending application Ser. No. 546,552, dated Jun. 29, 1990, and entitled "Mounting System for Installation of Communication Boxes and Method of Mounting Communication Blocks," whose priority is hereby claimed.

FIELD OF THE INVENTION

This invention relates generally to housings for printed circuit boards, and more particularly to housings adapted for high density storage.

BACKGROUND OF THE INVENTION

Conventionally, electronic products use outer housings, sometimes called boxes, to protectively enclose printed circuit ("pc") boards, while typically providing external access to electrical connectors, switches, and/or input/output devices connected to the pc boards.

The sizes of the housings are usually dictated by aesthetics and/or engineering considerations, such as, for example, the need for heat dissipation from the pc board. Traditionally, the need for heat dissipation caused the housings to be larger, i.e., oversized, so as to provide room for air currents to remove unwanted heat from the interior of the housings.

Advances in the engineering of the pc board and components thereon have diminished or eliminated the need for oversized housings, and have permitted the use of housings of compact design. For example, desk-top electronic products such as certain personal computers are now characterized by smaller housings, e.g., "small-footprint" or "slim line" housings.

This reduction in the so-called "package" size of the electronic components is advantageous in a variety of applications. Indeed, as computers and computer systems have increasingly become part of the office environment rather than relegated to back rooms or dedicated "computer offices," computer purchasers and users have embraced the reduction in the size of the housings. A reason is that the smaller housings take up less space on work surfaces, e.g., desk tops, on which the electronic products are frequently placed during use. The more efficient use of space has become a primary consideration in the modern office environment.

With the widespread acceptance of computers in the office environment, it is desirable to have other components of the computer system, e.g., bridges, repeaters, and various other network components, located there as well. Locating network components in the office environment can facilitate network management by the responsible individuals, and can maximize system flexibility though use of distributed facilities.

Unfortunately, such components have heretofore been located within sizable electronic racks or cabinets that are generally regarded, e.g., as too unsightly to be located within the office area. It would be desirable to design such network components so that they can be situated in the office itself, and do so in such a way that they need not occupy valuable office work surfaces.

With the increased use of electronic products in the office environment, electromagnetic interference ("EMI") and radio-frequency interference ("RFI") have become important considerations in the design of such products. Various techniques have been proposed for using housings to shield electrical components on printed circuit boards in order to limit the emission of EMI and RFI created by them, or to protect them from external sources of EMI and RFI that could affect their operation.

Commonly assigned U.S. Pat. No. 4,959,752 discloses an approach to EMI/RFI shielding that involves the use of a substantially continuous, conformal coating on the interior surfaces of the housing. The coating has a first layer of electrically-insulating coating material, and a second layer of electrically conducting coating material over the first layer.

While such a shielding approach is generally suitable for its intended purposes, the use of the coating materials imposes certain constraints on the design of the housings. For instance, since electrical contact between the pc boards and the coating material could cause short circuits on the pc boards, or otherwise impair operation of the electronic products, appropriate techniques must to be employed to avoid such contact and its untoward results.

A simple approach to avoiding such electrical contact is to provide an extra safety margin of space between the pc boards and the housing interiors. Unfortunately, the compact housings described above do not offer the luxury of such additional interior room. Larger housings could be used, but this solution compromises the space efficiencies realized by the compact housings, and would be unacceptable to many purchasers and users.

SUMMARY OF THE INVENTION

The invention resides in an EMI/RFI shielded housing of compact generally-rectangular design suitable for computer system products (such as, e.g., bridges or repeaters) that permits such a product to be used on office work surfaces or in a wall-mounted, high-density storage system within a general office environment.

The housing has a generally-rectangular, pc board container portion defining an interior space for receiving a pc board. A removable front cover closes the container. A back wall of the container has windows for exposing electrical connectors or other devices that require access from the exterior of the container. The housing preferably also has a removable trough-like rear cover that covers the container back wall and protects the exposed connectors and other devices located thereat while the product is used, e.g., on an office work surface during use.

The container back wall also has support features that permit the housing to be supported in a high-density storage system during use. For such storage, the rear cover is removed to expose the support features and electrical connectors for physical and electrical connection to the storage system.

In a further aspect of the invention, the housing has pc-board-support features that precisely position and support the pc board within the housing in such a way as to avoid contact between the pc board circuitry and the EMI/RFI-shield coating on the interior of the housing. Preferably, the clearance between the pc board and the interior surfaces is minimized so as to minimize the size of the housing.

The pc-board-support features include a plurality of retainers on the front cover and the back wall of the container that mate with slots in the periphery of the pc board and hold the board at a selected vertical and horizontal position within the housing.

For instance, at least one of the retainers can have a generally sideways-"H"-shaped cross-section such that the center element of the "H" is receivable within a corresponding one of the slots. Also, at least one retainer on the interior back wall of the container has a ramp section for guiding the pc board into its proper position during assembly.

In addition, for EMI/RFI shielding, the front cover of the housing preferably has top and bottom rows of shielding tabs along its periphery which project a substantial distance (e.g., about a half inch (1.3 cm)) into the container after the front cover is attached thereto to provide a continuation of the shielding across the marginal gap between the front cover and the container.

In another aspect of the invention, the housing has a connector-access button in the shape, e.g., of a spherical segment with a central hole, which is disposable within a circular hole in the top wall of the container and projects downwardly into the interior of the container. The button defines an interior space, and permits a male electrical connector on the pc board to extend through the central hole and into that space so as to be accessible from the exterior for manual connection thereto of a suitable female connector.

The concave configuration of the button provides sufficient "finger" room for manual access to the male connector. In addition, the concave shape permits the free end of the male connector to remain below the height of the top wall of the container, and thereby preserves the housing's compact design.

In order to permit the pc board to be readily inserted into the housing during assembly, the connector-access button is preferably removable from the housing. For assembly, the connector access button can be press-fitted into the container without the need for tools, and it remains in place by virtue of an interference fit with the container's top wall.

In yet another aspect of the invention, the housing has an ornamental design preferably molded into the exterior surface of the top wall and connector-access button of the container. To assure proper orientation of the button with respect to the top wall and thereby preserve the integrity of the design, the button and top wall have angular-orientation-maintaining features. These features include, e.g., a detent on the outer circumference of the button that mates with a detent-receiving groove on the container.

BRIEF DESCRIPTION OF THE DRAWING

The above and further advantages of the invention may be better understood by referring to the following description in conjunction with the accompanying drawings, in which:

FIG. 7 is an enlarged perspective view of the connector button of FIG. 1;

FIG. 8 is a perspective view of a high-density storage system including a plurality of the housings of FIG. 1; and FIG. 9 is a simplified illustration of a housing-mounting arrangement for the storage system of FIG. 8.

DETAILED DESCRIPTION OF ILLUSTRATIVE EMBODIMENT

Figure 1:
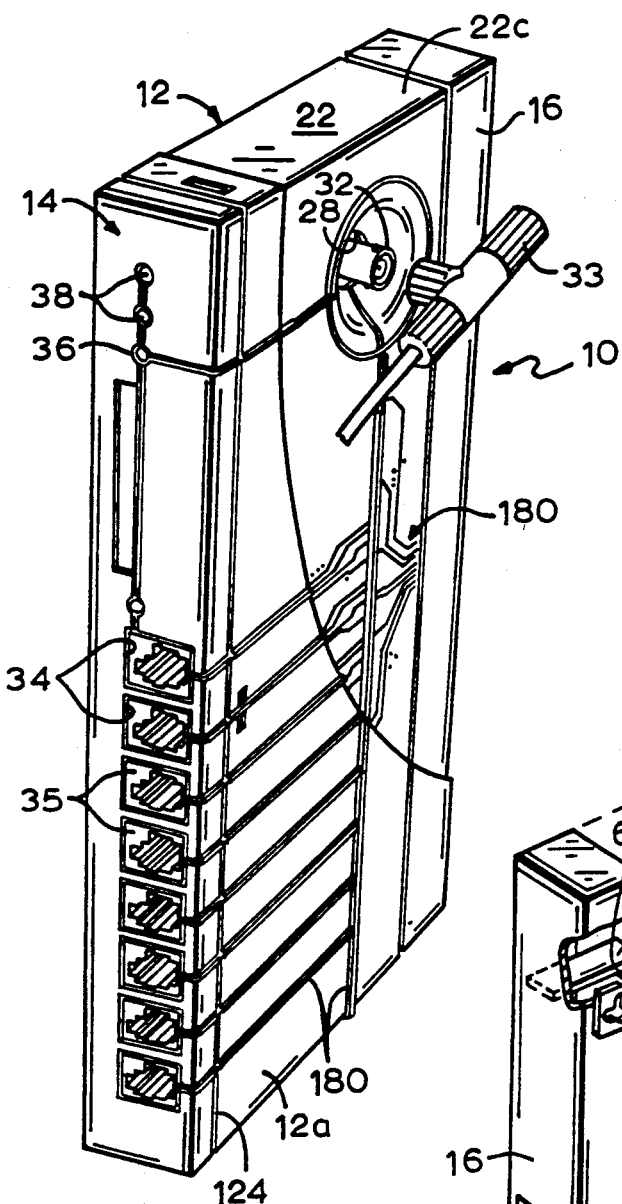
FIG. 1 is a perspective view of a housing in accordance with the invention.
Figure 2:
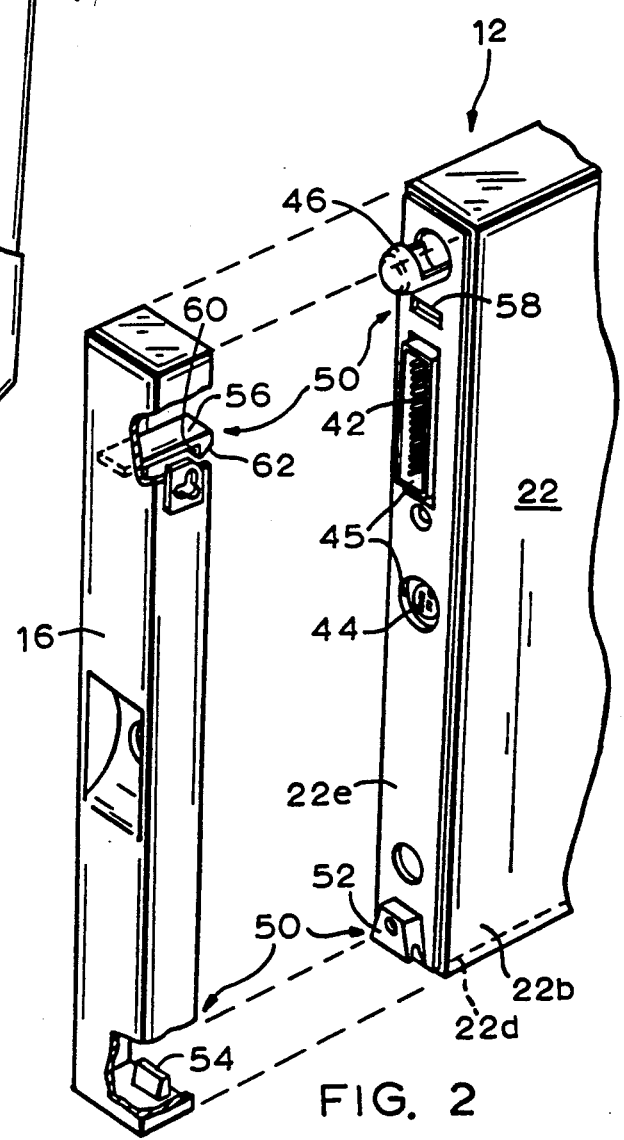
FIG. 2 is an exploded, rear perspective view of the housing of FIG. 1 showing attachment features for the rear cover thereof.

FIGS. 1 and 2 show a box-like printed circuit board ("pc") housing 10 in accordance with the invention. The housing 10 includes a pc board container 12, a front cover 14, and a trough-like rear cover 16.

Figure 3:
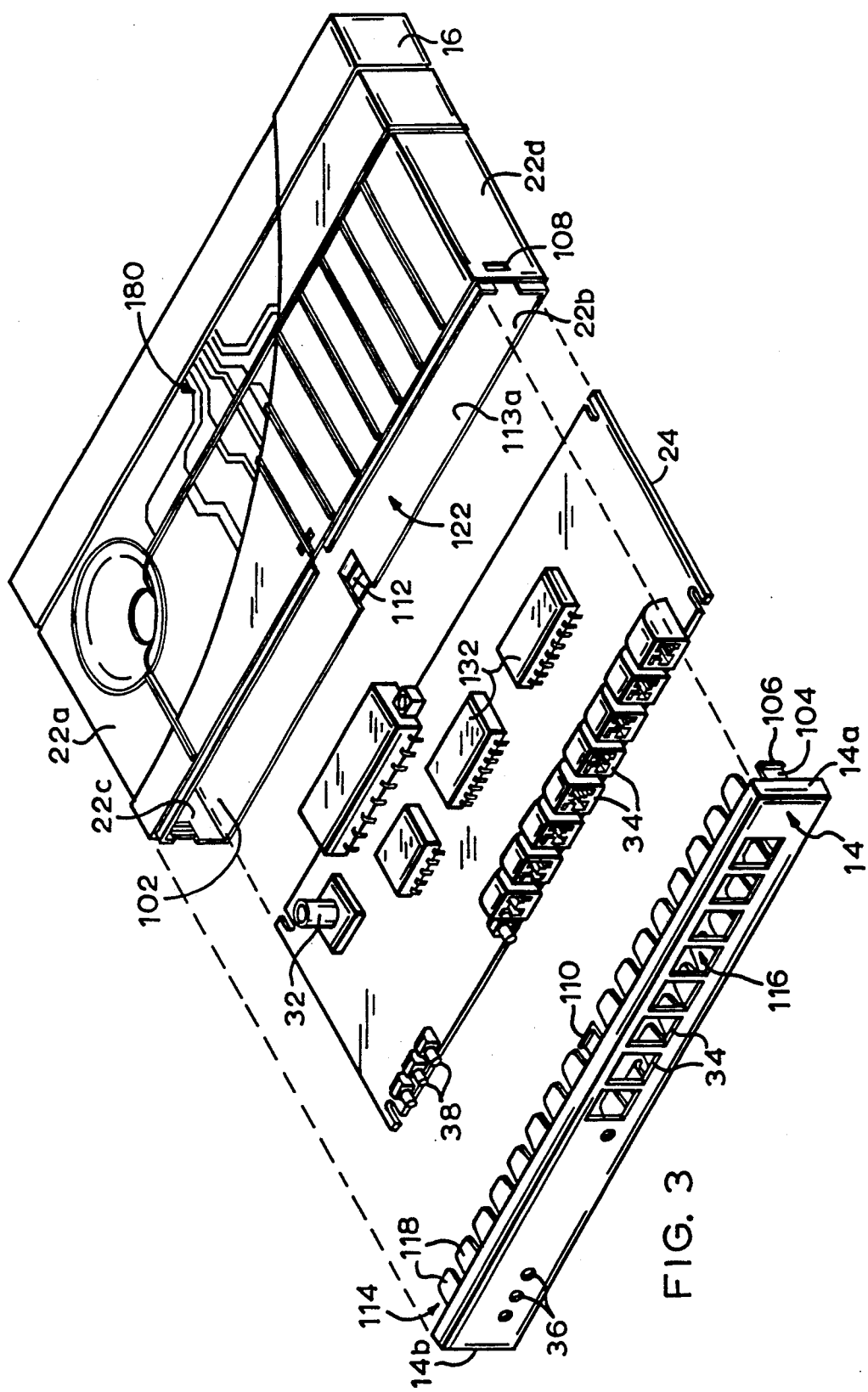
FIG. 3 is an exploded, perspective view of the housing of FIG. 1, and printed circuit board contained therein.

The PC board container 12 has a generally-rectangular main housing portion 22. The main housing portion 22 has top and bottom, generally parallel walls 22a, 22b (FIG. 2), generally parallel side walls 22c, 22d (FIG. 2), and a back wall 22e (FIG. 2). The walls 22a-22e are edgewise connected orthogonally together to form a box-like structure defining an interior space 12f (FIG. 3) for receiving a conventional pc board 24 (FIG. 3).

The container 12 also has a connector-access button 26 in the form of, e.g., a spherical segment having a central hole 28. The connector-access button 26 is removably mounted in a circular hole 30 (FIG. 7) in the top wall 26a of the main housing portion 22. A generally-cylindrical male electrical connector 32, mounted end-wise on the pc board 24, extends through the central hole 28 and into the interior space of the button 26. Preferably, the free end 32a of the male connector 32 does not extend beyond the top wall 22a of the container 12.

For use, a female connector 33 can engage the male connector 36. The illustrated connectors 32, 33 are bayonet-type connectors that mutually engage one another for assured physical and electrical connection. The shape of the connector-access button 26 provides the requisite "finger room" for making this connection.

The front cover 14 has a plurality of rectangular openings 34 for providing access to PC board connectors 35, and a plurality of circular windows 36 for exposing to view PC board-mounted light emitting diodes 38. These features are representative of the types of connections, switches or other input/output devices that can be provided.

The rear cover 16 has a generally "C"-shaped cross-section, and is releasably attachable to the PC board container 12 as shown in FIG. 2. When secured on the container 12, the rear cover 16 serves to cover and protect pc-board-mounted electrical receptacles 42, 44 exposed at the rear of the main housing portion 22 through windows 45 along the back wall 22e. Removing the rear cover 16, permits access to the receptacles 42, 44, and, in addition, to a mounting hook 46. The mounting hook 46 is adapted and configured to permit the housing 10 to be supported, e.g., in a high density storage system, as will be described below with reference to FIG. 8.

A hook and latch arrangement 50 secures the rear cover 16 to the PC board container 12. More specifically, the hook and latch arrangement 50 includes a hook 52 on the back wall 22e proximate one end thereof that can mate with a mounting stud 54 on the corresponding end of the rear cover 16. In addition, at the other end of the back wall 22e and rear cover 16, the arrangement 50 has a flexible latch arm 56 on the rear cover 16 that can be received within a rectangularly-shaped hole 58 through the back wall 22e. The latch arm 56 has a detent 60 in the form of a depending projection at its free end.

The latch arm 56 is suitably configured and made of an appropriately resilient material so that, as the latch arm 56 enters the hole 58, the back wall 12e bends the latch arm 56 slightly in an upward direction in FIG. 2. When the detent 60 enters the container 12, the latch arm 56 snaps back to its normal or "at rest" position as shown, whereupon detent 60 is trapped within the container 12 against the inside of the back wall 12e. For these purposes, the lever arm 56 is provided with a tapered leading edge 62 to facilitate insertion into the hole 58.

Figure 2A:
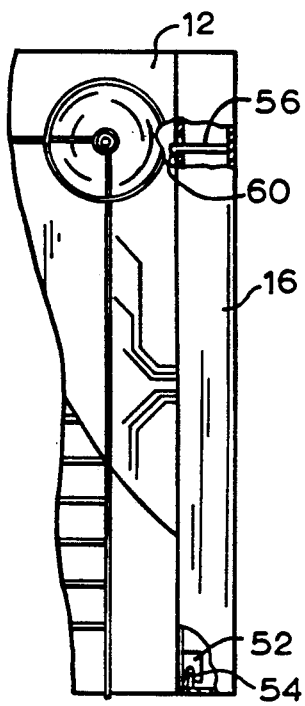
FIG. 2A is a partial, front elevational view, partially broken away, showing the rear cover in its latched position on the housing of FIG. 1.

FIG. 2a shows the hook and latch arrangement in a latched position. The mounting stud 54 is captured within hook 52, whereby that end of the rear cover 16 is secured to the container 12. Also, the latch arm 56 is received within hole 58 and is retained therein due to the detent 60 bearing against the inside of the container 12.

Figure 2B:
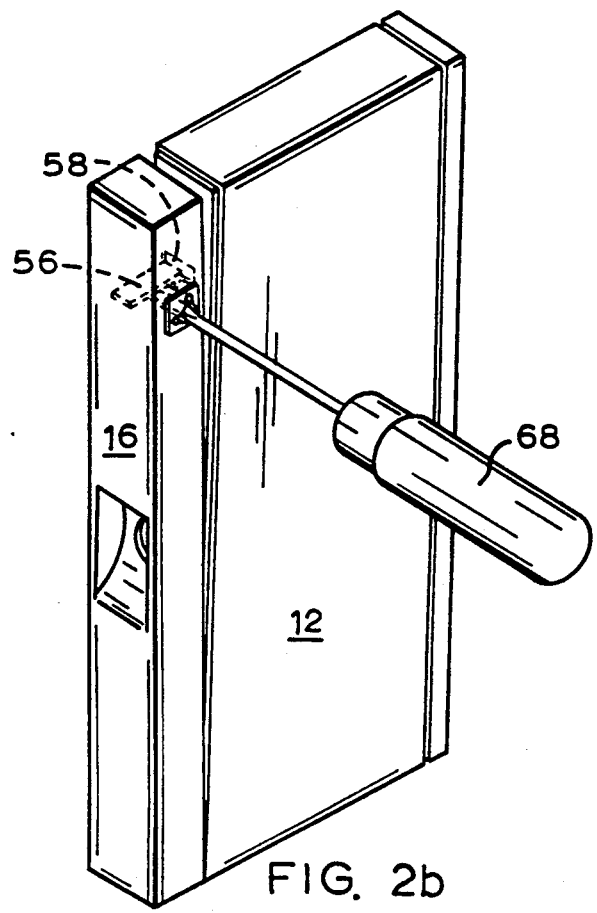
FIG. 2B is a perspective view of the housing of FIG. 1 during disassembly using a disassembly tool.
Figure 2C:
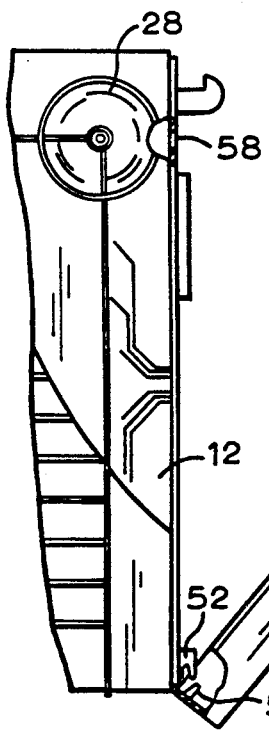
FIG. 2C is a partial, front elevational view showing the housing of FIG. 1 at a further stage of disassembly.

FIG. 2b depicts a first stage in disassembly of the rear cover from the container 12. A disassembly tool 68, such as a conventional flat-head screw driver in inserted into a side hole 72 of the rear cover 16, and the tip of the tool 68 is driven upwardly against the bottom of the latch arm 56 near its free end. This causes the latch arm 56 flex, thereby aligning the detent 60 with hole 58. This, in turn, permits that end of the rear cover 16 to be separated from the container 12. Then, as shown in FIG. 2c, the mounting stud 54 can be lowered out of the hook 52, so as to free the rear cover 16.

Figure 4:
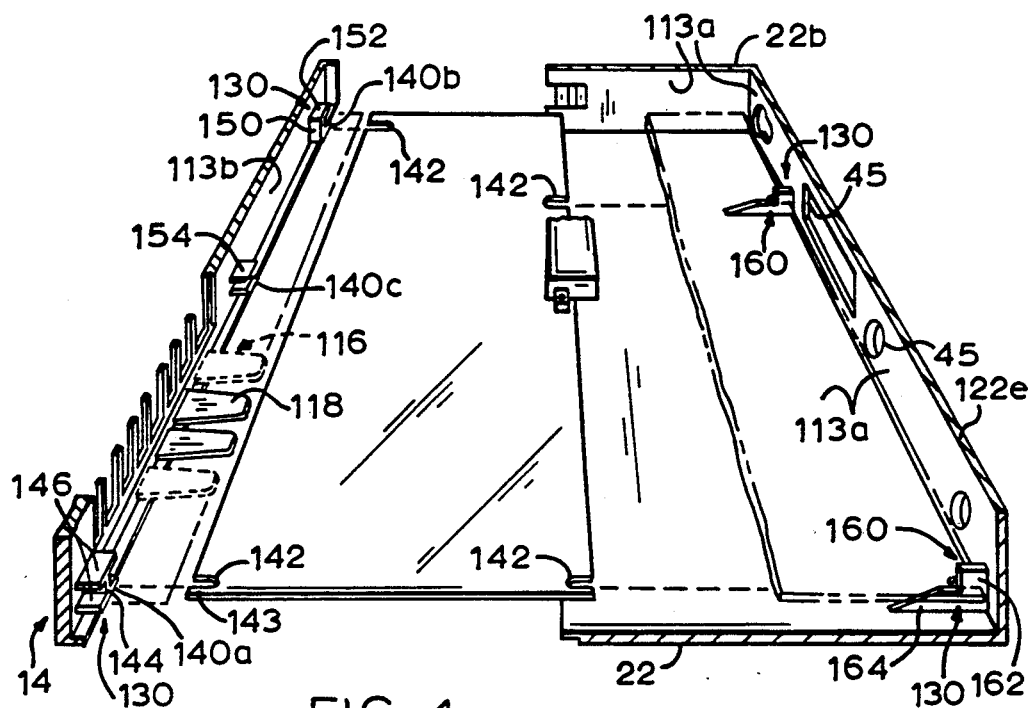
FIG. 4 is another exploded, perspective view, partially cut-away, of the housing of FIG. 1 showing the printed-circuit-board-holding features.

As shown in FIGS. 3 and 4, the front cover 14 has, at each end 14a, 14b, a latch tab 104 (of which only one is shown in the drawings) that serves to releasably attach the front cover 14 to the container 12. The latch tabs 104 are configured similar to the latch arm 56, and have detents 106 at their free ends.

During assembly, as the front cover 14 is placed over a "rim" 106 of the container 12, the side walls 22c, 22d bend the latch tabs 104, until the detents 106 snap into rectangular holes 108 in the side walls 22c, 22d, where they are captured by the interior walls of the holes 108, and thereby retain the front cover 14 to the container 12.

Yet a third latch tab 110 disposed intermediate the ends 14a, 14b of the front cover 14 can engage a corresponding rectangular hole 112 in the bottom wall 22b in the manner just described.

Preferably, the interior surfaces 113a of the main housing portion 22 and the inside surface 113b of the front cover 14 are coated with an EMI/RFI material, as described in the above-mentioned U.S. Pat. No. 4,959,752, whose disclosure is incorporated herein by reference.

Figure 5:
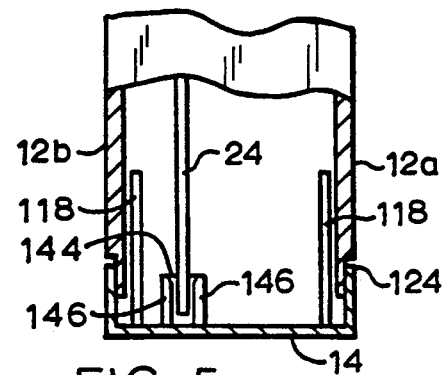

As shown in FIGS. 3-5, the front cover 14 also has top and bottom rows 114, 116 of EMI/RFI shielding tabs 118 disposed along its top and bottom periphery. After assembly of the housing 10, the shielding tabs 118 extend a substantial distance (e.g., a half inch (1.3 cm)) into the interior space 122 of the container 12 adjacent the top and bottom walls 12a, 12b so as to provide EMI/RFI shielding across the marginal gap 124 (FIGS. 1 and 7) between the container 12 and the front cover 14.

As shown in FIGS. 4 and 5, the housing 10 also has pc-board-support features 130 that precisely position and support the pc board 24 within the housing 10. The precise positioning of the pc board 24 avoids contact of the pc board circuitry (not shown) on the underside thereof, and of the components 132 (FIG. 3) mounted thereon, to the EMI/RFI-shield coating on the interior surfaces 113a, 113b of the container 12, while preferably minimizing the clearance between the pc board 24 and the interior surfaces 113a, 113b so as to minimize the size of the housing 12.

The pc-board-support features 130 include a plurality of retainers 140a-140c projecting outwardly from the interior surface 113b of the front cover 14. The retainers 140a and 140b are adapted and configured to mate with grooves or slots 142 in the periphery, preferably the corners 143, of the pc board 24 after assembly, and thereby hold the board at a selected position in the vertical direction (i.e., in the direction from the top to bottom walls 22a, 22b) and the horizontal direction (i.e., in the direction between the side walls 22c, 22d) within the container 12.

The retainers 140a-140c can be of various shapes. Generally "H"-shaped retainer 140a has a vertical abutment wall 144 that is receivable with no more than minimal clearance within a corresponding one of the slots 142 for maintaining the horizontal position of the pc board 24, and two, laterally-extending, spaced, generally-parallel abutment walls 146 extending horizontally with respect to wall 144 that can receive therebetween the thickness of the pc board 24 with no more than minimal clearance for maintaining its vertical position, as shown in FIG. 5.

Another retainer 140b can have a generally squared-off-"C"-shape, with vertical and horizontal walls 150, 152 analogous to those just described and operating in the same fashion to position the pc board 24.

Yet another retainer 140c can have just two, laterally-extending, spaced, generally-parallel walls 154 that serve to position the pc board 24 only in the vertical direction.

The pc-board-supporting features 130 also include retainers 160 along the interior of the back wall 22e in the form of vertically directed abutment walls 162 that are receivable within corresponding slots 142, again, with no more than minimal clearance. The retainers 160 preferably also have ramp sections 164 for guiding the pc board 24 into its ramp position during assembly.

Figure 6A:
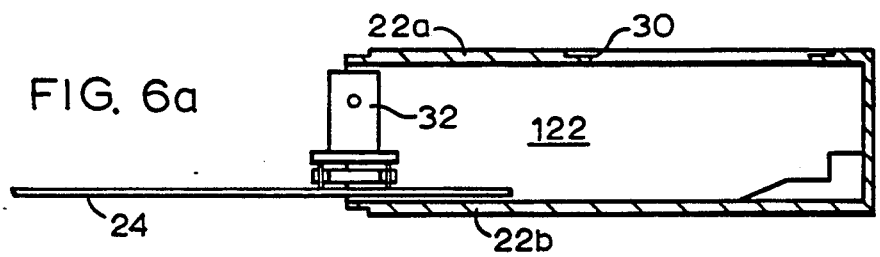
FIGS. 6A-6C are sectional views of the housing of FIG. 1 showing various steps during insertion of the printed circuit board therein.
Figure 6B:
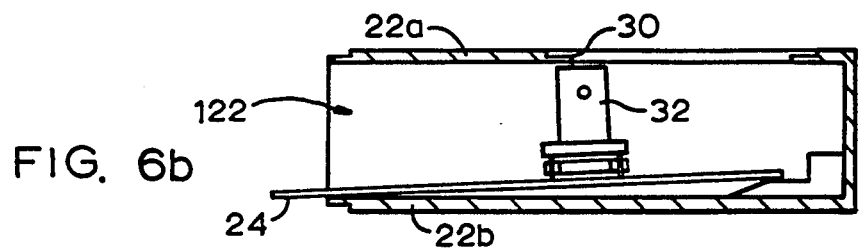
Figure 6C:
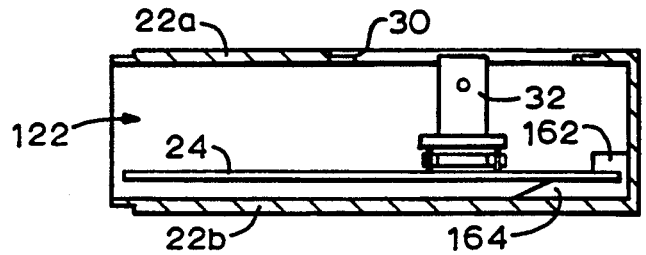

FIGS. 6a-6c depict insertion of the pc board 24 into the container 12. In FIG. 6a, the pc board 24 is slid into the interior 170 of the container 12 along the bottom wall 22b to provide sufficient clearance below the top wall 22a for the distal end of male connector 28. Then, as can be seen in FIG. 6b, as the pc board 24 encounters the ramp sections 164, they cause the pc board 24 to tilt toward the top wall 22a as the male connector 28 enters the circular hole 32. FIG. 6c shows the pc board 24 in its fully inserted position, with the abutment wall 162 within the slot 142 (FIG. 5), and the pc board 24 generally in spaced, parallel relation to the top and bottom walls 22a, 22b. The housing 10 is then ready for the front cover 14 to be placed on the container 12, as described above and illustrated in FIG. 7.

As shown in FIG. 7, after the pc board 24 is properly positioned in the container 22, the connector-access button 26 is inserted within the circular hole 30 in the top wall 22a. A plurality of radially-extending, circumferentially-spaced retaining elements 170 that are preferably integral with the connector-access button 26 provide an interference fit for the button 26 within the circular hole 30, and thereby retain it therein. While the connector-access button 24 is inserted in the container 12, a top rim 172 of the button 26 rests on a lip 174 of reduced height formed by the top wall 22a about the circular hole 30. With this arrangement, the top surface 176 of the button 26 is substantially coplanar with the top wall 22a.

As shown in FIG. 1, 3 and 7, the housing 10 has an ornate design 180 having the appearance of an electrical circuit. The design 180 is located on the PC board container 12, including both the main housing portion 22, the connector-access button 26, and the front cover 14. To assure proper orientation of the button 26 with respect to the top wall 22a, and thereby preserve the integrity of the design 180, the connector-access button 26 and top wall 22a have angular-orientation-maintaining features 182. As shown in FIG. 7, these features 182 include, e.g., a detent or radially projecting element 184 on the outer circumference of the connector access button 26 that mates with a detent-receiving slot 186 on the container 12.

As shown in FIG. 8, the housing 10 is adapted for use in a high-density storage system 200 mountable on a wall (not shown), which system is further described in the related application mentioned hereinabove, whose disclosure is incorporated herein by reference. The storage system 200 is adapted to hold and support the weight of a plurality of the housings 10, along with other devices, such as that shown at 202 during use thereof.

FIG. 9 shows an arrangement 204 for supporting a housing 10 on a mounting hub 206 of the storage system 200. For mounting the housing 10 on the mounting hub 206, the rear cover 16 (FIG 1) is removed to expose the mounting hooks 46, 52 and the electrical connectors 42, 46 for physical and electrical connection to the storage system.

Then, hook 52 is placed over a mounting stud 208 of the mounting hub 206, and the housing 10 is pivoted upwardly to a vertical orientation. As the housing 10 assumes this orientation, the electrical connectors 42, 46 (FIG. 1) mate with suitable connectors (not shown) carried by the hub 206. Also, the mounting hook 46 enters a hole 210 in the mounting hub 206, and, as it does, the hook 46 drives a retainer arm 212 upwardly. After the hook 46 is fully within the hole 210, the retainer arm 212 drops back down by virtue of gravity to a position behind the hook 46. This causes the housing 10 to be retained by the hub 206.

To remove the housing 10 therefrom, the retainer arm 210 is raised manually, and the housing is pivoted, and removed from the hub 206.

It should be emphasized that the hook 46 is used both to retain the rear cover 16 (FIG. 1) on the housing 10, and, at other times, for attaching the housing 10 to the mounting hub 206.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. An EMI/RFI shielded housing of compact design for protectively enclosing a printed circuit board, said housing being of a design suitable for computer system products, said housing permitting said products to be used alternatively both on an office work surface and in a wall-mounted, high-density storage system within an office environment, said housing comprising:
    A) a five-sided printed circuit board container defining an interior space for receiving a printed circuit board, said container having a back wall defining at least one window for exposing a connector that requires access from the exterior of said container, and a top wall having a hole,
    B) a removable front cover for closing said container,
    C) a removable rear cover for covering said container back wall and protecting said exposed connector located thereat,
    D) support means for permitting said housing to be supported in the high-density storage system during use, said support means being located on said back wall and being exposed when said rear cover is removed, and
    E) wherein said container and front cover have a plurality of interior surfaces coated with an EMI/RFI shielding material, and
    F) a connector-access button defining an interior volume and having a central hole, said button being disposable within said top wall hole, and projecting downwardly into the interior space of said container, said connector-access button permitting an electrical connector on the printed circuit board to protrude into the interior volume of the button so as to be accessible from the exterior of the container for manual connection thereto of a female connector.

2. The housing in accordance with claim 1, further comprising printed-circuit-board-support means for precisely positioning and supporting the printed circuit board within the housing in such a way as to avoid contact between the printed circuit board and the EMI/RFI-shielding material.

3. The housing in accordance with claim 2, wherein said printed-circuit-board-support means includes a plurality of retainers disposed on said container and front cover that mate with a plurality of grooves in the periphery of the printed circuit board, and hold the printed circuit board at a selected vertical and horizontal position within said housing.

4. The housing in accordance with claim 3, wherein at least one of said retainers has a generally "H"-shaped cross-section.

5. The housing in accordance with claim 3, wherein at least two of said retainers include ramp sections disposed along a bottom wall of said container for guiding said printed circuit board into position during assembly.

6. The housing in accordance with claim 1, wherein, while said front cover closes said container, said front cover and container define a marginal gap therebetween, and wherein said front cover further includes first and second rows of shielding tabs along the periphery of the front cover, said shielding tabs projecting a substantial distance into said container after the front cover is attached thereto to provide a continuation of EMI/RFI shielding across the marginal gap.

7. The housing in accordance with claim 1, wherein said electrical connector has a free end that extends into said interior volume to a height less than that of the top wall.

8. The housing in accordance with claim 1, wherein said connector-access button is shaped substantially as a spherical segment.

9. The housing in accordance with claim 1, wherein said connector-access button includes means for maintaining said button within said container hole with an interference fit.

10. The housing in accordance with claim 1, wherein said container and connector-access button comprise an exposed top surface having an ornamental design thereon, and means for maintaining the angular orientation of the top surface of said button with respect to the top wall of the container so as to preserve the integrity of the design.

11. The housing in accordance with claim 10, wherein said orientation-maintaining means comprises a detent on the outer circumference of said button that mates with a detent-receiving groove on said container.

12. A housing for protectively enclosing a printed circuit board assembly having an elongated, electrical connector extending from a printed circuit board, said housing comprising:

A) a five-sided printed circuit board container defining an interior space for receiving said printed circuit board assembly, said container having a top wall with an opening, a bottom wall in spaced, generally parallel relation to said top wall, and a back wall;

B) a removable front cover for closing said container; and

C) a connector-access button of a generally concave shape with a central hole, said button being removably received within said container opening, said connector-access button extending into said interior space such that the distance between said connector-access button and said printed circuit board is less than the distance of a free end of said electrical connector from said printed circuit board, said electrical connector extending through said central hole of said button and into a space defined by said button of sufficient size that enables manual connection of a mating connector to said electrical connector.

13. The housing in accordance with claim 12, wherein said container, and front cover have a plurality of interior surfaces coated with an EMI/RFI shielding material, and wherein said connector-access button and said electrical connector cooperate so as to substantially close said container opening.

14. The housing in accordance with claim 13, wherein, while said front cover closes said container, said front cover and container define a marginal gap therebetween, and wherein said front cover further includes first and second rows of shielding tabs along the periphery of said front cover, said shielding tabs projecting a substantial distance into said container to provide a continuation of EMI/RFI shielding across said marginal gap.

15. The housing in accordance with claim 12, wherein the distance of said free end of said electrical connector from said printed circuit board is less than that of said top wall of said container from said printed circuit board.

16. The housing in accordance with claim 12, wherein said connector-access button includes means for maintaining said button within said container opening with an interference fit.

17. The housing in accordance with claim 12, wherein said container and connector-access button comprise an exposed top surface having an ornamental design thereon, and means for maintaining the angular orientation of said top surface of said button with respect to said top wall of said container so as to preserve the integrity of the design.

18. The housing in accordance with claim 17, wherein said orientation-maintaining means comprises a detent on the outer periphery of said button that mates with a detent-receiving groove on said container.

19. The housing in accordance with claim 12, further including a hook connected to said container for suspending said housing from a support.

20. The housing in accordance with claim 19, further including a removable rear cover for covering said container back wall and said hook when said housing is not suspended by said hook.

21. The housing in accordance with claim 12, wherein said printed circuit board further includes a plurality of peripherally-disposed slots, and said container back wall and front cover include a plurality of retainers adapted and configured to mate with said slots, thereby maintaining said printed circuit board in spaced, parallel relation to said container top and bottom walls.

22. The housing in accordance with claim 21, wherein said retainers on said container back wall include a plurality of vertically directed abutment walls, and a ramp section defined between said container bottom and back walls for guiding said printed circuit board during insertion thereof into said housing from said bottom wall to a position in which said abutments walls are received with minimal clearance within corresponding ones of said slots.

23. For use with an electrical housing comprising (i) a five-sided printed-circuit-board container defining an interior space for receiving a printed circuit board having an elongated electrical connector mounted thereon and extending therefrom, a top wall having an opening, a bottom wall in spaced, generally parallel relation to said top wall, and a back wall; (ii) a connector-access button having a central hole for receiving said electrical connector therethrough, said connector-access button being adapted for closing said top wall opening, said connector-access button extending into said interior space such that the distance between said connector-access button and said printed circuit board is less than the distance of a free end of said electrical connector from said printed circuit board; and (iii) a removable front cover for closing said container; a method of inserting said printed circuit board into said housing comprising the steps of:

A) sliding said printed circuit board into said container along said bottom wall to provide sufficient clearance below said top wall for said electrical connector to pass thereunder;

B) sliding said printed circuit board up a ramp section defined proximate said container bottom and back walls, thereby tilting said printed circuit board toward said container top wall as said electrical connector assumes a position corresponding to said container opening;

C) after sliding said printed circuit board up said ramp section, maintaining said printed circuit board in spaced, parallel relation to said container top and bottom walls;

D) after said sliding steps, placing said front cover on said container, and said connector-access button in said opening, such that said electrical connector extends through a hole in said connector-access button.

24. The method in accordance with claim 23, wherein said printed circuit board has peripherally-disposed slots, and said container back wall and front cover include retainers adapted and configured to mate with said slots, and said maintaining and front-cover-placing steps comprise the step of causing said retainers to be received within said slots for maintaining said printed circuit board in position within said container.

25. An EMI/RFI shielded housing for protectively enclosing a printed circuit board, said housing comprising:

A) a printed circuit board container defining an interior space for receiving said printed circuit board; and B) a removable front cover for closing said container, said front cover and container defining a marginal gap therebetween, and C) wherein said container and front cover have a plurality of interior surfaces coated with an EMI/RFI shielding material, and D) wherein one of said front cover and said container further include a plurality of shielding tabs disposed along the periphery thereof and projecting into the other of said container and front cover, said shielding tabs being configured, sized and disposed so as to provide a continuation of EMI/RFI shielding across said marginal gap.

26. The EMI/RFI shielded housing in accordance with claim 25, wherein said shielding tabs are disposed along first and second rows, are connected to said front cover, and extend a substantial distance into said container adjacent top and bottom walls thereof.

27. The EMI/RFI shielded housing in accordance with claim 25, wherein said container further includes a rim receivable within said front cover.

* * * * *